United States Patent
Ding et al.

(10) Patent No.: US 8,956,721 B2
(45) Date of Patent: Feb. 17, 2015

(54) SURFACE TREATMENT METHOD FOR METAL SUBSTRATE AND COATED ARTICLE MANUFACTURED BY THE SAME

(71) Applicants: Shenzhen Futaihong Precision Industry Co., Ltd., Shenzhen (CN); FIH (Hong Kong) Limited, Kowloon (HK)

(72) Inventors: Ting Ding, Shenzhen (CN); Da-Hua Cao, Shenzhen (CN)

(73) Assignees: Shenzhen Futaihong Precision Industry Co., Ltd., Shenzhen (CN); FIH (Hong Kong) Limited, Kowloon (HK)

( * ) Notice: Subject to any disclaimer, the term of this patent is extended or adjusted under 35 U.S.C. 154(b) by 161 days.

(21) Appl. No.: 13/720,117

(22) Filed: Dec. 19, 2012

(65) Prior Publication Data
US 2014/0017446 A1    Jan. 16, 2014

(30) Foreign Application Priority Data
Jul. 10, 2012    (CN) .......................... 2012 1 02368894

(51) Int. Cl.
| | |
|---|---|
| C23F 17/00 | (2006.01) |
| C25F 3/02 | (2006.01) |
| C23C 14/00 | (2006.01) |
| C23C 14/06 | (2006.01) |
| C23C 14/34 | (2006.01) |
| C23C 14/35 | (2006.01) |
| C23C 28/04 | (2006.01) |
| C23C 28/00 | (2006.01) |

(52) U.S. Cl.
CPC . *C23F 17/00* (2013.01); *C25F 3/02* (2013.01); *C23C 14/0015* (2013.01); *C23C 14/0635* (2013.01); *C23C 14/0641* (2013.01); *C23C 14/345* (2013.01); *C23C 14/35* (2013.01); *C23C 28/042* (2013.01); *C23C 28/322* (2013.01); *C23C 28/34* (2013.01); *C23C 28/341* (2013.01); *C23C 28/3455* (2013.01)
USPC .......... 428/216; 428/156; 428/336; 428/469; 428/472; 428/698; 428/701; 428/702

(58) Field of Classification Search
USPC ......... 428/156, 216, 336, 469, 472, 698, 701, 428/702
See application file for complete search history.

(56) References Cited

U.S. PATENT DOCUMENTS

| | | | | |
|---|---|---|---|---|
| 4,640,869 | A  * | 2/1987 | Loth | 428/469 |
| 5,079,089 | A  * | 1/1992 | Ito et al. | 428/336 |
| 5,447,803 | A  * | 9/1995 | Nagaoka et al. | 428/698 |
| 6,197,438 | B1 * | 3/2001 | Faulkner | 428/698 |
| 7,758,975 | B2 * | 7/2010 | Schier | 428/698 |
| 8,021,768 | B2 * | 9/2011 | Ge | 428/216 |
| 8,178,222 | B2 * | 5/2012 | Miya et al. | 428/472 |

* cited by examiner

*Primary Examiner* — Archene Turner
(74) *Attorney, Agent, or Firm* — Novak Druce Connolly Bove + Quigg LLP

(57) ABSTRACT

A surface treatment method for metal substrate includes: a metal substrate is provided; a first color layer is deposited on the metal substrate, the first color layer being a TiC layer or a TiN layer; a second color layer is deposited on the first color layer, the first color layer being a CrC layer or a CrN layer, the color of the first color layer being different from the color of the second color layer; forming a shielding layer on partially of the second color layer; electrochemical etching the metal substrate, the second color layer not covered with the shielding layer being removed to form a recessed portion, the recessed portion being extend through the second color layer. A coated article for manufactured by the surface treatment method is also provided.

9 Claims, 6 Drawing Sheets

SURFACE TREATMENT METHOD FOR METAL SUBSTRATE AND COATED ARTICLE MANUFACTURED BY THE SAME

BACKGROUND

1. Technical Field

The exemplary disclosure generally relates to a surface treatment method for metal substrate, and coated articles manufactured by the method.

2. Description of Related Art

To make a metal substrate appear to have a two color pattern, the metal substrate is usually treated by the following steps: a first color layer is deposited on the metal substrate by sputtering, and a second color layer is deposited on the first color layer by sputtering, the color of the first color layer is different from the color of the second color layer; portion of the second layer is masked by a shielding layer; the metal substrate is chemical etched by a etching liquid containing potassium permanganate and sulfuric acid, portion of the second layer not covered with the shielding layer is removed such that the first layer is partially exposed. However, when the concentration of the etching liquid is too high, the speed of reaction becomes too fast, causing the second color layer and the first color layer to be removed. When the concentration of the etching liquid is too low, etching liquid can etch neither the second color layer nor the first color layer. It is difficult to make the metal substrate show a two color pattern above mentioned conditions. Furthermore, even if the concentration of etching liquid is adjusted to an appropriate value, the first color layer is prone to corrosion by residual etching liquid, which will decrease the precision of the pattern.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the exemplary disclosure. Moreover, in the drawings, like reference numerals designate corresponding parts throughout the several views. Wherever possible, the same reference numbers are used throughout the drawings to refer to the same or like elements of an embodiment.

DETAILED DESCRIPTION

Figure 1:
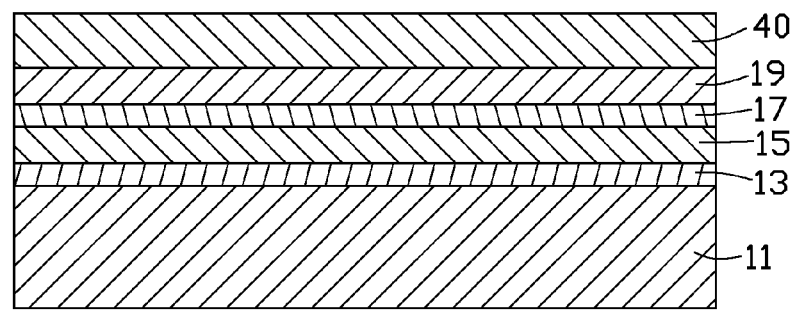
FIG. 1 is a cross-sectional view of a metal substrate coated with a first color layer, a second color layer and a photosensitive layer.

Referring to FIG. 1, a surface treatment method for metal substrate may include at least following steps:

A metal substrate 11 is provided. The metal substrate 11 may be made of metal, such as stainless steel, titanium alloy, aluminum, aluminum alloy, magnesium or magnesium alloy, for example. The metal substrate 11 is cleaned using a cleaning solution. The cleaning solution can be ethanol, acetone and/or other organic solvents. A conventional ultrasonic cleaning device can be used to clean the metal substrate 11.

Figure 6:
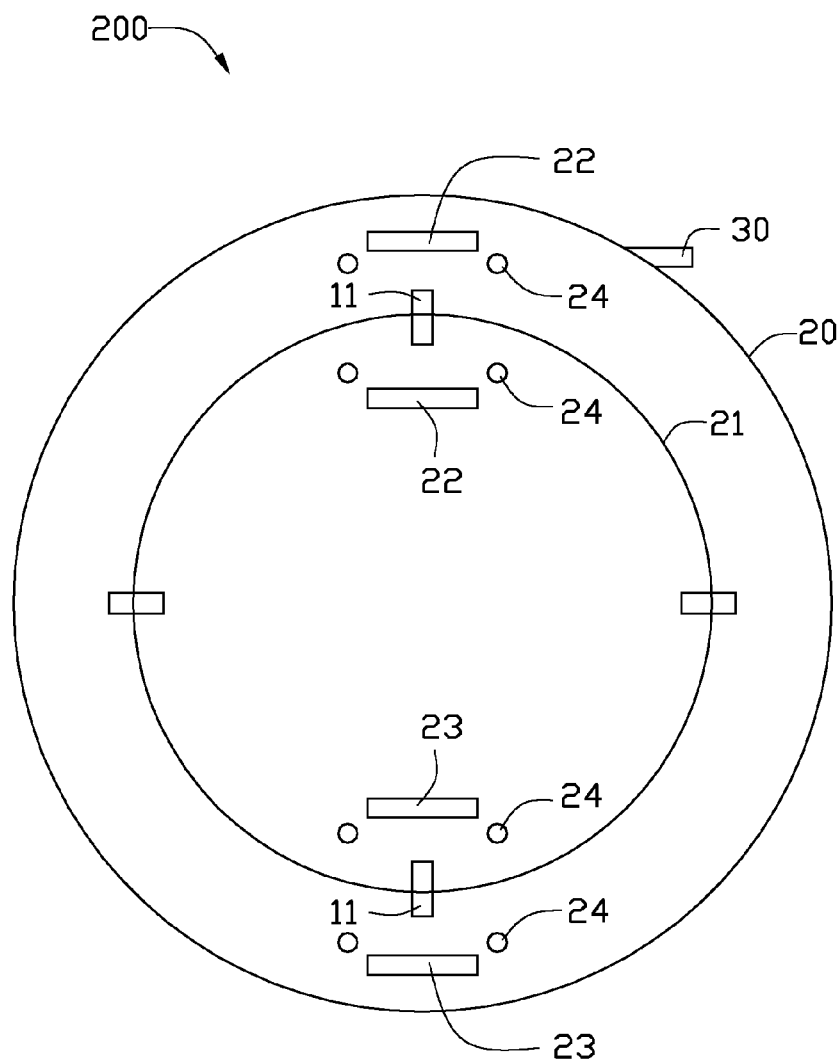
FIG. 6 is a schematic view of a vacuum sputtering device for manufacturing the coated article of FIG. 1.

FIG. 6 provides a vacuum sputtering device 200. The vacuum sputtering device 200 includes a chamber 20, a vacuum pump 30 connected to the chamber 20, and a conventional film thickness monitor (not shown) installed in the chamber 20. The vacuum pump 30 is used to evacuate the chamber 20. The film thickness monitor measures the thickness of deposited layer during the process of forming the deposited layer. The vacuum sputtering device 200 further includes a rotating bracket 21, two Ti targets 22 and two Cr targets 23 mounted therein, and a plurality of gas inlets 24. The metal substrate 11 is mounted rotatably in the rotating bracket 21. The two Ti targets 22 face each other, and are located on opposite two sides of the rotating bracket 21. The two Cr targets 23 face each other, and are located on the opposite two sides of the rotating bracket 21.

A primer layer 13 is deposited on the metal substrate 11. The primer layer 13 is a Ti layer. The chamber 20 is evacuated to about $6\times10^{-3}$ Pa to about $8\times10^{-3}$ Pa. The temperature of the inside of the chamber 20 is set to about 100° C. (Celsius degrees) to about 120° C. Argon gas may be used as a working gas and is fed into the chamber 20 at a flow rate from about 150 sccm to about 200 sccm. The Ti targets 22 in the chamber 20 are applied a power between about 8 kW to about 10 kW. A bias voltage of about −120 V to about −150 V is then applied to the metal substrate 11 to deposit the primer layer 13. Depositing the primer layer 13 may last for about 5 minutes (min) to about 8 min. The primer layer 13 has a thickness of about 0.1 μm to about 0.3 μm.

A first color layer 15 is deposited on the primer layer 13. The first color layer 15 is a TiC layer. The temperature of the inside of the chamber 20 is set to about 100° C. to about 120° C. Argon is fed into the chamber 20 at a flow rate from about 150 sccm to about 200 sccm. Ethyne ($C_2H_2$) may be used as a reaction gas and is fed into the chamber 20 at a flow rate from about 30 sccm to about 120 sccm. The Ti targets 22 in the chamber 20 are applied a power between about 8 kW to about 10 kW. A bias voltage of about −100 V to about −120 V is applied to the metal substrate 11 to deposit the first color layer 15. Depositing the first color layer 15 may last for about 50 minutes to 70 minutes. The first color layer 15 has a thickness of about 0.8 μm to about 1.1 μm.

The first color layer 15 includes Ti, C, and TiC. Ti element in first color layer 15 substantially exist as simple substance phase, due to the low flow rate of ethyne (about 30 sccm to about 120 sccm) during the depositing process. In the embodiment, the first color layer 15 has an L* value between about 28 to about 35, an a* value between about −1 to about 2, and a b* value between about −1 to about 2 in the CIE L*a*b*, so the first color layer 15 is black.

Alternatively, the first color layer 15 may be shown in a different color by changing the flow rate of ethyne and the deposition time.

Alternatively, the first color layer 15 can be a TiN layer instead of the TiC layer by using nitrogen gas instead of ethyne.

A bonding layer 17 is deposited on the first color layer 15. The bonding layer 17 is a Cr layer. The bonding layer 17 can enhance the bond between the first color layer 15 and subsequent layers. The temperature of the inside of the chamber 20 is set to about 100° C. to about 120° C. Argon is fed into the chamber 20 at a flow rate from about 150 sccm to about 200 sccm. The Cr targets 23 in the chamber 20 are applied a power between about 8 kW to about 10 kW. A bias voltage of about −100 V to about −120 V is applied to the metal substrate 11 to deposit the bonding layer 17. Depositing the bonding layer 17 may last for about 5 minutes to 8 minutes. The bonding layer 17 has a thickness of about 0.1 μm to about 0.2 μm.

A second color layer 19 is deposited on the bonding layer 17. The second color layer 19 is a CrC layer. The temperature of the inside of the chamber 20 is set to about 100° C. to about 120° C. Argon is fed into the chamber 20 at a flow rate from about 150 sccm to about 200 sccm. Ethyne may have a flow rate of about 30 sccm to about 60 sccm. The Cr targets 23 in the chamber 20 are applied a power between about 8 kW to about 10 kW. A bias voltage of about −100 V to about −120 V is applied to the metal substrate 11 to deposit the first color layer 15. Depositing the second color layer 19 may last for about 90 minutes to 120 minutes. The second color layer 19 has a thickness of about 1.0 μm to about 1.2 μm.

In the embodiment, the second color layer 19 has an L* value between about 68 to about 75, an a* value between about 0 to about 3, and a b* value between about 0 to about 3 in the CIE L*a*b*, so the second color layer 19 is white.

Alternatively, the second color layer 19 may be shown in a different color by changing the flow rate of ethyne and the deposition time.

Alternatively, the second color layer 19 can be a CrN layer instead of the CrC layer by using nitrogen gas instead of ethyne.

A photosensitive layer 40 is formed on the second color layer 19 by printing or spraying. The photosensitive layer 40 has a thickness of about 40 μm to about 60 μm.

Figure 2:
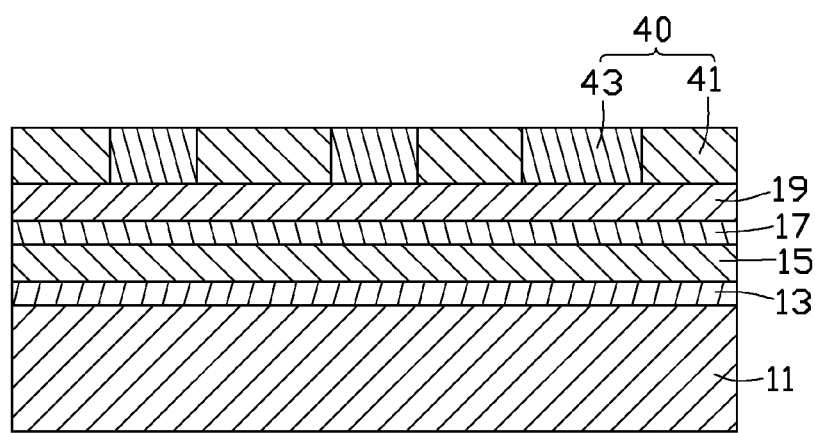
FIG. 2 is a cross-sectional view of the metal substrate of FIG. 1 coated with a shielding layer and a soluble layer.
Figure 3:
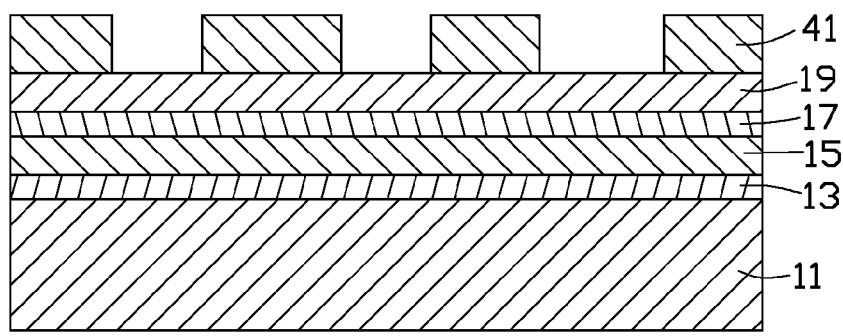
FIG. 3 is a cross-sectional view of the metal substrate of FIG. 2 after the soluble layer removed from the metal substrate.

Referring to FIGS. 2 and 3, a shielding layer 41 and a soluble layer 43 are formed on the second color layer 19 by exposing the photosensitive layer 40. Then, the soluble layer 43 dissolves during a developing process.

Figure 4:
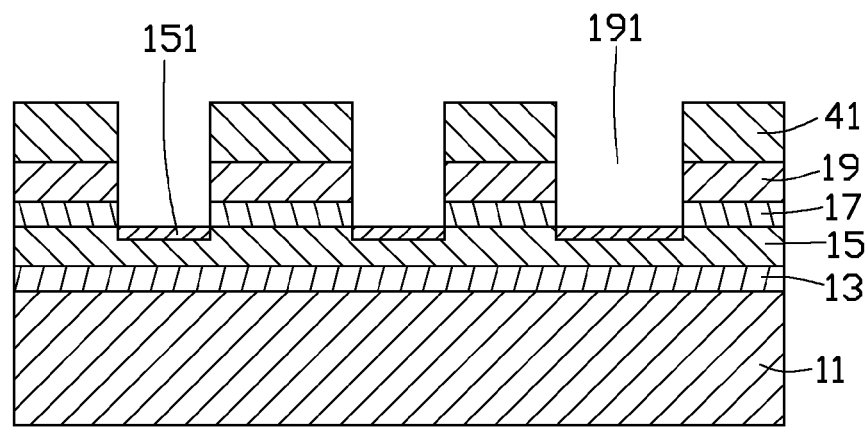
FIG. 4 is a cross-sectional view of the metal substrate of FIG. 3 defined with recessed portion.

Referring to FIG. 4, a recess portion 191 extended through the second color layer 19 and the bonding layer 17 is formed by electrochemical etching except for areas defining the shielding layer 41.

During the electrochemical etching process, an etching liquid is for etching the metal substrate 11 containing potassium permanganate and sulfuric acid. In the etching liquid, the mass percentage of potassium permanganate about 5% to about 10%, the mass percentage of sulfuric acid about 10% to about 15%. The metal substrate 11 is immersed in the etching liquid and used as anode. A plate made of lead is used as cathode. The temperature of the etching liquid is about 20° C. to about 30° C. The current density is about 3 A/dm$^2$ to about 5 A/dm$^2$. The electrochemical etching lasts about 6 min to about 9 min.

Alternatively, the etching liquid may be a sodium hydroxide solution at a mass percentage of about 5%-8%. The temperature of the sodium hydroxide solution is about 20° C. to about 30° C. The current density is about 1 A/dm$^2$ to about 3 A/dm$^2$. The electrochemical etching lasts about 1 min to about 2 min.

During the electrochemical etching process, portion of the first color layer 15 is exposed to the etching liquid, due to portion of the bonding layer 17 and the second color layer 19 not covered with the shielding layer 41 dissolved in the etching liquid. At the same time, the metal substrate 11 used as the anode takes place the following reaction: $4OH^- = O_2 + 2H_2O + 4e$. Then, the exposed first color layer 15 is oxidized by oxygen to form a titanium dioxide layer 151 on the first color layer 15. The titanium dioxide layer 151 having a high density is un-soluble in the etching liquid, thus preventing the first color layer 15 from dissolving. The titanium dioxide layer 151 has no negative effect on the color of the first color layer 15, due to the titanium dioxide layer 151 having a thickness of about 1 nm to about 3 nm.

In the embodiment, the current density is about 3 A/dm$^2$ to about 5 A/dm$^2$ to make the metal substrate 11 appear to have a two color pattern. If the current density is higher than 5 A/dm$^2$, the speed of etching process becomes too fast, causing the first color layer 15 dissolves in the etching liquid. If the current density is lower than 3 A/dm$^2$, the time for removing the second color layer 19 and the bonding layer 17 not covered with the shielding layer 41 will increases, causing the increasing of production costs.

The electrochemical etching lasts about 6 min to about 9 min. If the etching time is less than 6 min, the second color layer 19 and the bonding layer 17 not covered with the shielding layer 41 cannot be completely removed form the metal substrate 11; If the etching time is longer than 9 min, the first color layer 15 is prone to dissolve in the etching liquid. Additionally, controlling the time of the etching process can also avoid the thickness of the titanium oxide layer 151 being too thick which will negatively affecting the appearance of the metal substrate 11.

Simultaneously, when the sodium hydroxide solution is used as the etching liquid, the current density is about 1 A/dm$^2$ to about 3 A/dm$^2$ and the electrochemical etching lasts about 1 min to about 2 min, to make the metal substrate 11 appear to have a two color pattern.

The shielding layer 41 is removed, and the second color layer 19 is exposed.

Figure 5:
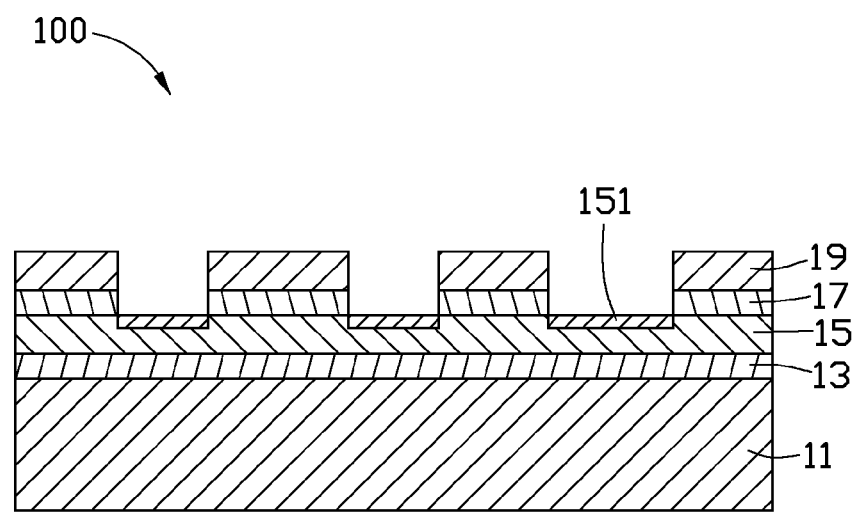
FIG. 5 is a cross-sectional view of an exemplary embodiment of a coated article.

FIG. 4 and FIG. 5 show an exemplary embodiment of an coated article 10 created by the method. The coated article 10 includes a metal substrate 11, a primer layer 13, a first color layer 15, a bonding layer 17 and a second layer 19 formed on the metal substrate 11 in that order. The coated article 10 further includes a recessed portion 191. The recessed portion 191 is extended through the second color layer 19 and the bonding layer 17. The color of the first color layer 15 is different from the color of the second color layer 19.

The metal substrate 11 may be made of metal, such as stainless steel, titanium alloy, aluminum, aluminum alloy, magnesium or magnesium alloy.

The primer layer 13 is a Ti layer. The primer layer 13 has a thickness of about 0.1 μm to about 0.3 μm.

The first color layer 15 is a TiC layer. A titanium dioxide layer 151 is formed on the first color layer 15 corresponding to recessed portion 191. The titanium dioxide layer 151 has a thickness of about 1 nm to about 3 nm. Portion of the first color layer 15 not covered with the titanium dioxide layer 151 has a thickness of about 0.8 μm to about 1.1 μm.

The first color layer 15 covered with the titanium dioxide layer 151 has an L* value between about 28 to about 35, an a* value between about −1 to about 2, and a b* value between about −1 to about 2 in the CIE L*a*b*, thus the color of the first color layer 15 covered with the titanium dioxide layer 151 is same with the color of the first color layer 15. The roughness (Ra) of the titanium dioxide layer 151 is about 0.1 μm to about 0.3 μm.

The bonding layer 17 is a Cr layer. The bonding layer 17 has a thickness of about 0.1 μm to about 0.2 μm.

The second color layer 19 is a CrC layer. The second color layer 19 has a thickness of about 1.0 μm to about 1.2 μm. The second color layer 19 has an L* value between about 68 to about 75, an a* value between about 0 to about 3, and a b* value between about 0 to about 3 in the CIE L*a*b*, so the second color layer 19 is white.

The depth of the recessed portion 191 is about 1.1 μm to about 1.4 μm.

Alternatively, as previously mentioned the first color layer 15 can be a TiN layer instead of the TiC layer.

Alternatively, as previously mentioned, the second color layer 19 can be a CrN layer instead of the CrC layer.

Alternatively, the primer layer 13 can be omitted, and the first color layer 15 can be directly formed on the metal substrate 11.

Alternatively, the bonding layer 17 can be omitted, and the second color layer 19 can be directly formed on the first color layer 15.

It is to be understood, however, that even through numerous characteristics and advantages of the exemplary disclosure have been set forth in the foregoing description, together with details of the system and function of the disclosure, the disclosure is illustrative only, and changes may be made in detail, especially in the matters of shape, size, and arrangement of parts within the principles of the disclosure to the full extent indicated by the broad general meaning of the terms in which the appended claims are expressed.

What is claimed is:

1. A coated article comprising:
    a metal substrate;
    a first color layer formed on the metal substrate, the first color layer being a TiC layer or a TiN layer;
    a second color layer formed on the first color layer, the first color layer being a CrC layer or a CrN layer, the color of the first color layer being different from the color of the second color layer; and
    a recessed portion formed on the second color layer, the recessed portion being extended through the second color layer, a titanium dioxide layer being formed on the second color layer corresponding to the recessed portion.

2. The coated article as claimed in claim 1, wherein the titanium dioxide layer has a thickness of about 1 nm to about 3 nm.

3. The coated article as claimed in claim 2, wherein the roughness (Ra) of the titanium dioxide layer is about 0.1 µm to about 0.3 µm.

4. The coated article as claimed in claim 2, wherein the first color layer covered with the titanium dioxide layer has an L* value between about 28 to about 35, an a* value between about −1 to about 2, and a b* value between about −1 to about 2 in the CIE L*a*b*.

5. The coated article as claimed in claim 1, wherein the second color layer has a thickness of about 1.0 µm to about 1.2 µm.

6. The coated article as claimed in claim 5, wherein the second color layer has an L* value between about 68 to about 75, an a* value between about 0 to about 3, and a b* value between about 0 to about 3 in the CIE L*a*b*.

7. The coated article as claimed in claim 1, wherein the depth of the recessed portion is about 1.1 µm to about 1.4 µm.

8. The coated article as claimed in claim 1, wherein when the first color layer is a TiC layer, Ti element in first color layer substantially exist as simple substance phase.

9. The coated article as claimed in claim 1, wherein the coated article further comprise a bonding layer formed between the first color layer and the second color layer, the recessed portion is extend through the second color layer and the bonding layer.

* * * * *